US012693182B2

(12) United States Patent
Watanabe et al.

(10) Patent No.:  US 12,693,182 B2
(45) Date of Patent:      Jul. 28, 2026

(54) SENSOR DEVICE INCLUDING ELASTIC COVER INCLUDING PORTIONS WITH VARYING HEIGHTS AND A GAP BETWEEN PORTIONS

(71) Applicant: Murata Manufacturing Co., Ltd., Nagaokakyo (JP)

(72) Inventors: Hiroshi Watanabe, Nagaokakyo (JP); Kohei Sugahara, Nagaokakyo (JP); Koichi Inoue, Nagaokakyo (JP); Takatoshi Kato, Nagaokakyo (JP)

(73) Assignee: MURATA MANUFACTURING CO., LTD., Kyoto (JP)

(\*) Notice: Subject to any disclaimer, the term of this patent is extended or adjusted under 35 U.S.C. 154(b) by 328 days.

(21) Appl. No.: 18/404,941

(22) Filed: Jan. 5, 2024

(65) Prior Publication Data

US 2024/0142323 A1      May 2, 2024

Related U.S. Application Data

(63) Continuation of application No. PCT/JP2022/027065, filed on Jul. 8, 2022.

(30) Foreign Application Priority Data

Jul. 21, 2021      (JP) ................................. 2021-120854

(51) Int. Cl.
*G01L 1/24*          (2006.01)
*G01L 5/16*          (2020.01)
(Continued)

(52) U.S. Cl.
CPC .................. *G01L 1/24* (2013.01); *G01L 5/16* (2013.01); *G01L 5/226* (2013.01); *G01V 8/12* (2013.01);
(Continued)

(58) Field of Classification Search
CPC .. G01L 1/24; G01L 5/226; G01L 5/16; G01V 8/12; G01V 9/00; G01V 11/00; H10F 55/00
See application file for complete search history.

(56) References Cited

U.S. PATENT DOCUMENTS

2010/0253650 A1\*  10/2010  Dietzel ................. G06F 3/0414
73/800
2011/0067504 A1    3/2011  Koyama et al.
(Continued)

FOREIGN PATENT DOCUMENTS

JP          S60168028 A      8/1985
JP          5089774 B2      12/2012
(Continued)

OTHER PUBLICATIONS

International Search Report in PCT/JP2022/027065, mailed Sep. 20, 2022, 3 pages.
(Continued)

*Primary Examiner* — Helen C Kwok
(74) *Attorney, Agent, or Firm* — Keating & Bennett, LLP

(57) ABSTRACT

A sensor device includes a force sensor on a substrate, a light emitter to emit light from over the substrate, a light receiver to receive light on the substrate and detect proximity of an object, and an elastic member made of an elastic material and including a first portion covering the force sensor, a second portion extending around the light emitter and the light receiver, through at least spaces between the light emitter, the light receiver, and the force sensor, and a third portion coupling the first portion and the second portion to each other. The third portion in the elastic member has a lower height from the substrate than the first and second portions.

18 Claims, 15 Drawing Sheets

(51) Int. Cl.

| | | |
|---|---|---|
| *G01L 5/22* | (2006.01) |
| *G01V 8/12* | (2006.01) |
| *G01V 9/00* | (2006.01) |
| *G01V 11/00* | (2006.01) |
| *H10F 55/00* | (2025.01) |

(52) U.S. Cl.
CPC ............... *G01V 9/00* (2013.01); *G01V 11/00* (2013.01); *H10F 55/00* (2025.01)

(56) References Cited

U.S. PATENT DOCUMENTS

| | | | | |
|---|---|---|---|---|
| 2011/0188025 A1* | 8/2011 | Haas | ..................... | H10F 77/407 |
| | | | | 257/80 |
| 2012/0240691 A1 | 9/2012 | Wettels et al. | | |
| 2014/0103199 A1* | 4/2014 | Loong | ................... | G01S 7/4813 |
| | | | | 250/214.1 |
| 2014/0326882 A1 | 11/2014 | Tar et al. | | |
| 2015/0177082 A1* | 6/2015 | Sawada | ................... | G01L 5/166 |
| | | | | 901/47 |

| | | | | |
|---|---|---|---|---|
| 2015/0177366 A1* | 6/2015 | Halbritter | ............. | G01S 7/4813 |
| | | | | 250/216 |
| 2016/0356642 A1* | 12/2016 | Uedaira | ................ | G01S 7/4816 |
| 2017/0297206 A1* | 10/2017 | Correll | ..................... | B25J 15/08 |
| 2017/0363464 A1* | 12/2017 | Shafer | ...................... | G01D 5/30 |
| 2019/0341518 A1* | 11/2019 | Chua | ..................... | H10F 55/255 |
| 2021/0310835 A1* | 10/2021 | Kato | ........................ | G01C 3/00 |
| 2022/0128397 A1* | 4/2022 | Watanabe | ................ | G01V 8/20 |
| 2022/0276405 A1* | 9/2022 | Watanabe | ............. | H10F 55/255 |

FOREIGN PATENT DOCUMENTS

| | | | |
|---|---|---|---|
| WO | 2009144767 A1 | 12/2009 |
| WO | 2021100261 A1 | 5/2021 |

OTHER PUBLICATIONS

Written Opinion in PCT/JP2022/027065, mailed Sep. 20, 2022, 3 pages.

* cited by examiner

SENSOR DEVICE INCLUDING ELASTIC COVER INCLUDING PORTIONS WITH VARYING HEIGHTS AND A GAP BETWEEN PORTIONS

CROSS REFERENCE TO RELATED APPLICATIONS

This application claims the benefit of priority to Japanese Patent Application No. 2021-120854 filed on Jul. 21, 2021 and is a Continuation Application of PCT Application No. PCT/JP2022/027065 filed on Jul. 8, 2022. The entire contents of each application are hereby incorporated herein by reference.

BACKGROUND OF THE INVENTION

1. Field of the Invention

The present invention relates to a sensor device to detect a force resulting from contact of an object and proximity of an object.

2. Description of the Related Art

Various sensors mounted on, for example, a robot hand or a human machine interface to enable various types of sensing such as proximity or contact of an object have been developed in recent years.

Japanese Patent No. 5089774 discloses a complex sensor attached to, for example, a robot hand. The complex sensor includes a touch sensor and a proximity sensor. The touch sensor includes a flexible pressure-sensitive sheet covering a fingertip portion. The touch sensor can detect a load exerted on the pressure sensitive sheet and the position of the load center. In the complex sensor according to Japanese Patent No. 5089774, the pressure sensitive sheet of the touch sensor has a through-hole. The through-hole in the pressure sensitive sheet of the touch sensor exposes a sensitive surface of the proximity sensor. Thus, the proximity sensor can detect an approach of an object to be grasped.

In the complex sensor according to Japanese Patent No. 5089774, the touch sensor has the through-hole for the proximity sensor. Thus, even when a target object that is in contact uniformly exerts a pressing force on the touch sensor, the flexible touch sensor fails to be uniformly deformed. In addition, when the target object exerts an excessive force, the proximity sensor may be broken. The existing technology thus has a problem in reducing various types of interference that occurs in a sensor device that maintains compatibility between contact and proximity.

SUMMARY OF THE INVENTION

Preferred embodiments of the present invention provide sensor devices that are each able to reduce or prevent interference in compatibility between detection of a force from an object and detection of proximity of an object.

A sensor device according to a preferred embodiment of the present invention includes a substrate, a force sensor on the substrate, a light emitter to emit light from over the substrate, a light receiver to receive light on the substrate and detect proximity of an object, and an elastic member made of an elastic material. The elastic member includes a first portion covering the force sensor, a second portion extending around the light emitter and the light receiver, and through at least spaces between the light emitter, the light receiver, and the force sensor, and a third portion coupling the first portion and the second portion to each other. The third portion in the elastic member has a lower height from the substrate than the first and second portions.

The sensor devices according to preferred embodiments of the present invention are each able to reduce or prevent interference in compatibility between detection of a force from an object and detection of proximity of an object.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Sensor devices according to preferred embodiments of the present invention are described below with reference to the drawings.

Each preferred embodiment is a mere example. Two or more components between different preferred embodiments may naturally be switched for each other or combined with each other. In the second and following preferred embodiments, only different points are described without describing the same or corresponding points as those in the first preferred embodiment. Particularly, the same or substantially the same advantageous operational effects of the same or corresponding components are not separately described in each preferred embodiment.

First Preferred Embodiment

1. Outline

Figure 1:
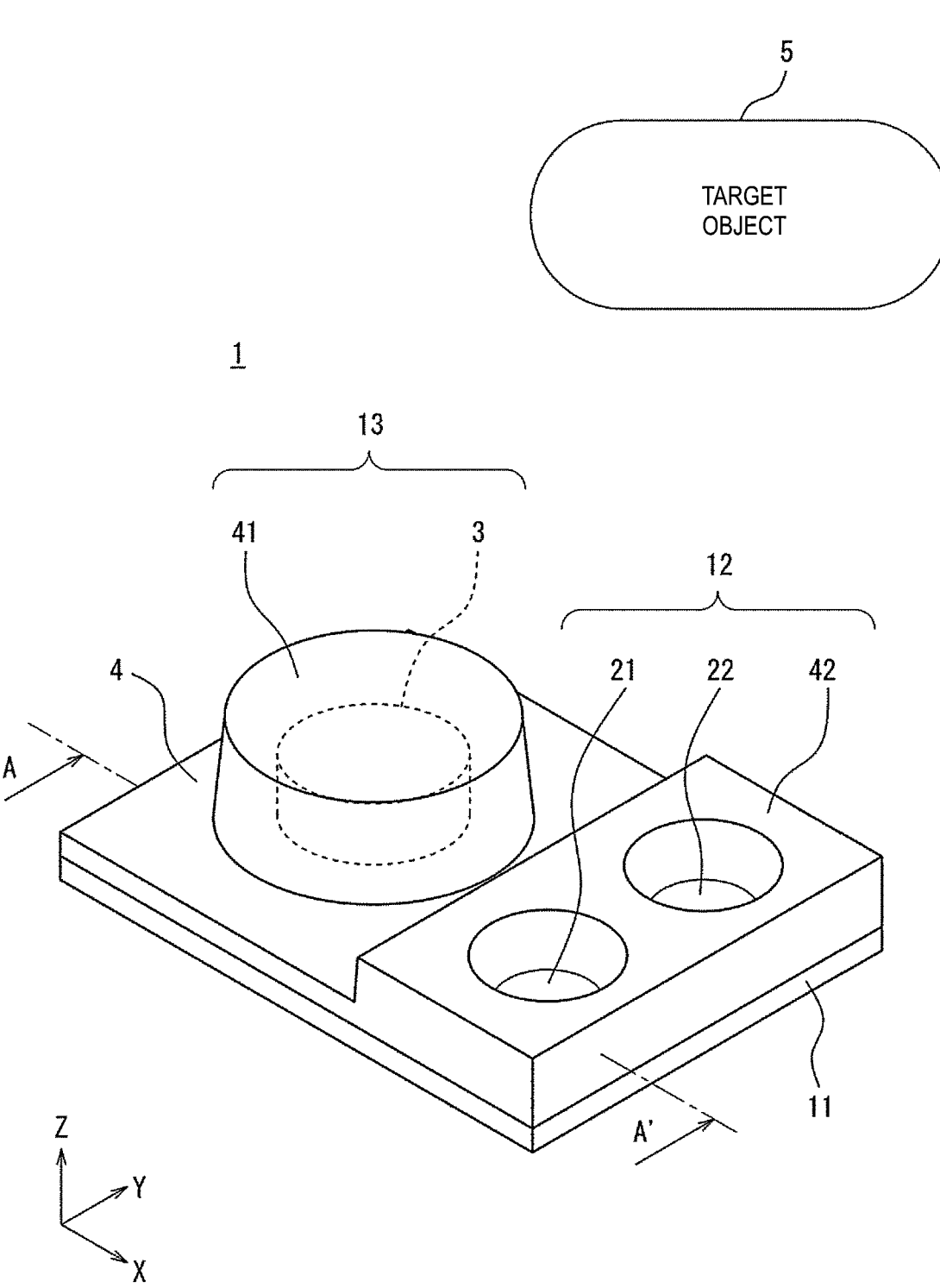
FIG. 1 is a perspective view of an outline of a sensor device according to a first preferred embodiment of the present invention.

An outline of the structure of a sensor device according to a first preferred embodiment of the present invention is described with reference to FIG. 1. FIG. 1 is a perspective view of the outline of a sensor device 1 according to the present preferred embodiment.

The sensor device 1 according to the present preferred embodiment is a sensor module that includes an integrated assembly including a proximity sensor 12 and a force sensor 13. The proximity sensor 12 detects proximity of a target object 5 with an optical detection method. The force sensor 13 detects a force (that is, a contact force) exerted when touched by the target object 5. The sensor device 1 is applicable in, for example, a robot hand for the purposes of detecting various types of objects to be grasped as the target object 5. The sensor device 1 is also applicable to a human machine interface (HMI) to be used as an input interface to convey various instructions or intensions from the human to machines or devices.

The sensor device 1 according to the present preferred embodiment can successively detect, for example, a series of processes of the target object 5 approaching, touching, and exerting a force on the sensor device 1, using the proximity sensor 12 and the force sensor 13. The sensor device 1 includes, for example, an assembly of the proximity sensor 12 and the force sensor 13 on a substrate 11. Hereinbelow, two directions parallel or substantially parallel to the main surface of the substrate 11 are defined as a X direction and a Y direction, and the direction perpendicular or substantially perpendicular to the main surface is defined as a Z direction. The +Z direction in which the force sensor 13 protrudes from the substrate 11 may also be referred to as an upward direction, and the −Z direction opposite to the +Z direction may also be referred to as a downward direction. In the sensor device 1 according to the present preferred embodiment, the force sensor 13 includes a force sensor device 3 and a cover portion 41 made of an elastic material to cover the force sensor device 3 from above (+Z). The proximity sensor 12 using an optical method includes a light emitter 21, a light receiver 22, and a cover portion 42 surrounding the light emitter 21 and the light receiver 22. The direction in which the force sensor 13 and the proximity sensor 12 are arranged side by side on the substrate 11 is defined as the X direction, the direction toward the force sensor 13 is defined as a −X direction, and the direction toward the proximity sensor 12 is defined as a +X direction.

The sensor device 1 according to the present preferred embodiment includes a cover 4. The cover 4 integrally includes the cover portion 41 to cover the force sensor and the cover portion 42 to cover the proximity sensor by extending an elastic material of the cover portion 41 in the +X direction. In the sensor device 1 according to the present preferred embodiment, the structure of the cover 4 reduces interference between the force sensor 13 and the proximity sensor 12 that may result from various causes, and facilitates compatibility between detection of a force resulting from contact of the target object 5 and detection of proximity of the target object 5.

The structure of the sensor device 1 according to the present preferred embodiment is described below in detail.

2. Structure

Figure 2:
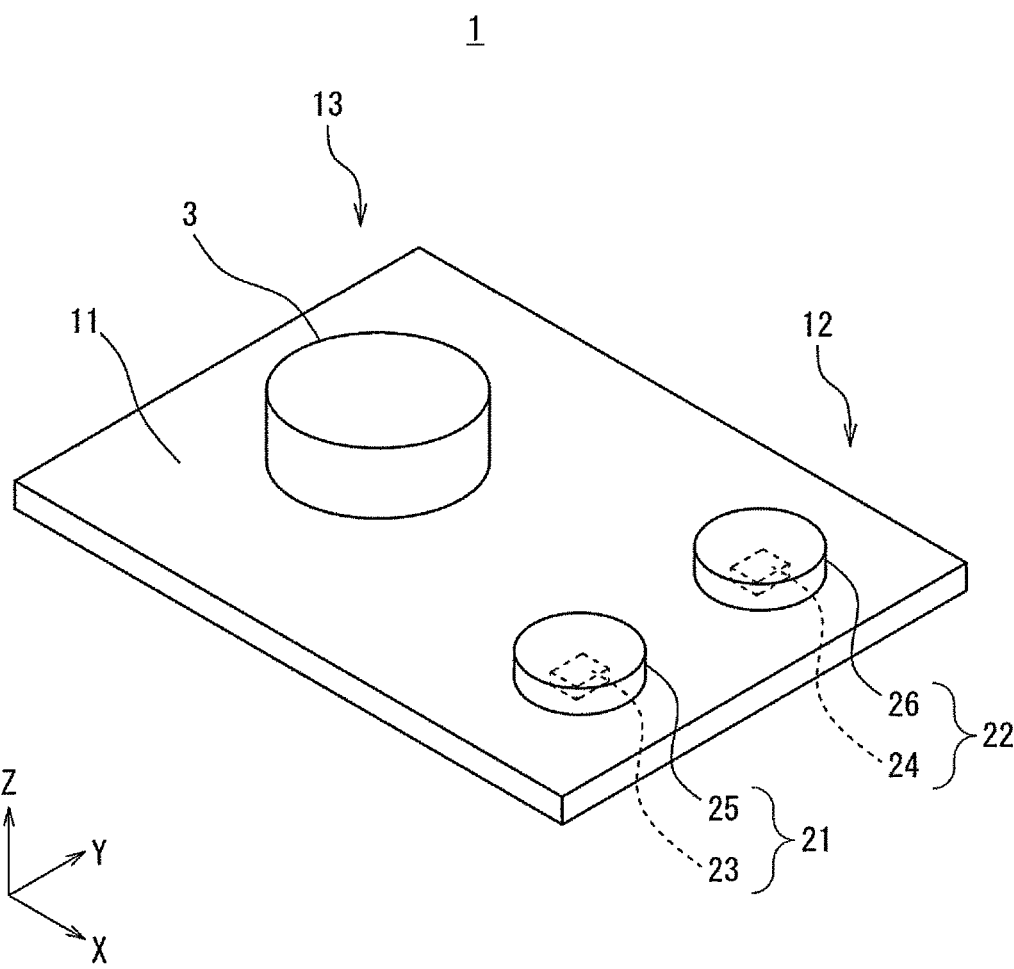
FIG. 2 is a perspective view of an example internal structure of the sensor device in FIG. 1.

FIG. 2 is a perspective view of an example internal structure of the sensor device 1 in FIG. 1. FIG. 2 illustrates an example where the sensor device 1 in FIG. 1 includes no cover 4.

In the sensor device 1 according to the present preferred embodiment, as illustrated in, for example, FIG. 2, the light emitter 21 and the light receiver 22 included in the proximity sensor 12 are arranged side by side the Y direction on the substrate 11, such as a rigid substrate, for example, at a portion in the +X direction from the force sensor 13. Hereinbelow, an example where the light emitter 21 is located in the −Y direction and the light receiver 22 is located in the +Y direction on the substrate 11 is described.

The light emitter 21 in the sensor device 1 is a portion in the proximity sensor 12 that emits light (hereinafter referred to as "detection light") to detect proximity of the target object 5. For example, as illustrated in FIG. 2, the light emitter 21 includes a light emitting device 23 and a sealant 25 that seals the light emitting device 23 with a material such as resin, for example.

The light emitting device 23 includes a light source element such as a light emitting diode (LED), for example. For example, the light emitting device 23 emits light having a predetermined wavelength range such as an infrared range, as the detection light. The light emitting device 23 includes a light emergence surface from which it emits detection light, and the light emergence surface faces upward.

Instead of an LED, the light emitting device 23 may include any of various solid light source elements, such as, a semiconductor laser (LD) or a vertical cavity surface emitting laser (VCSEL), for example. The light emitting device 23 may include multiple light source elements. The light emitting device 23 may include an optical system including components such as, for example, lenses and mirrors to collimate light from a light source element.

The light receiver 22 in the proximity sensor 12 is a portion that receives reflected light obtained by reflecting the detection light from the light emitter 21 off the target object 5, and detects proximity of the target object 5. As illustrated in, for example, FIG. 2, the light receiver 22 includes a light receiving device 24 and a sealant 26 that seals the light receiving device 24 with a material such as resin, for example.

The light receiving device 24 includes one or more light receivers such as, for example, photodiodes (PDs), and includes a light receiving surface including the light receivers. The light receiving device 24 receives light, such as reflected light obtained by reflecting the detection light off the target object 5, on the light receiving surface, and generates a light reception signal indicating, for example, the received light amount as a light reception result.

Instead of PDs, the light receiving device 24 may include any of various light receivers such as a phototransistor, a position sensitive device (PSD), a complementary metal oxide semiconductor (CMOS) image sensor (CIS), or a charge-coupled device (CCD), for example. The light receiving device 24 may include a linear array or a two-dimensional array of light receivers. The light receiving device 24 may include an optical system including, for example, lenses to collect the reflected light. The light receiving surface of the light receiving device 24 may receive, for example, a band pass filter that interrupts light of a wavelength range different from the wavelength range of the detection light. This filter can reduce or prevent the effect of disturbance light from the external environment.

The sealant 25 of the light emitter 21 and the sealant 26 of the light receiver 22 are formed as appropriate from a material such as, for example, a resin that has transparency to light in the wavelength range of the detection light of the proximity sensor 12. The upper surfaces of the sealants 25 and 26 define, for example, the respective heights of the light emitter 21 and the light receiver 22. The sealants 25 and 26 may have wavelength filter characteristics to selectively allow light in a specific wavelength range to pass therethrough.

In the present preferred embodiment, the force sensor 13 may use any of various force detection methods to detect a force from the target object 5. Various force detection methods include, for example, a piezoelectric method, an optical method, a strain resistance method, and an electrostatic capacity method. The force sensor 13 detects, for example, a multi-axial force such as a triaxial or hexaxial force. The force sensor device 3 is defined by any of various sensor elements corresponding to the force detection method used by the force sensor 13. The force sensor device 3 is an example of a force sensor according to the present preferred embodiment.

2-1. Cover

The structure of the cover 4 in the sensor device 1 according to the present preferred embodiment is described with reference to FIGS. 3 and 4.

Figure 3:
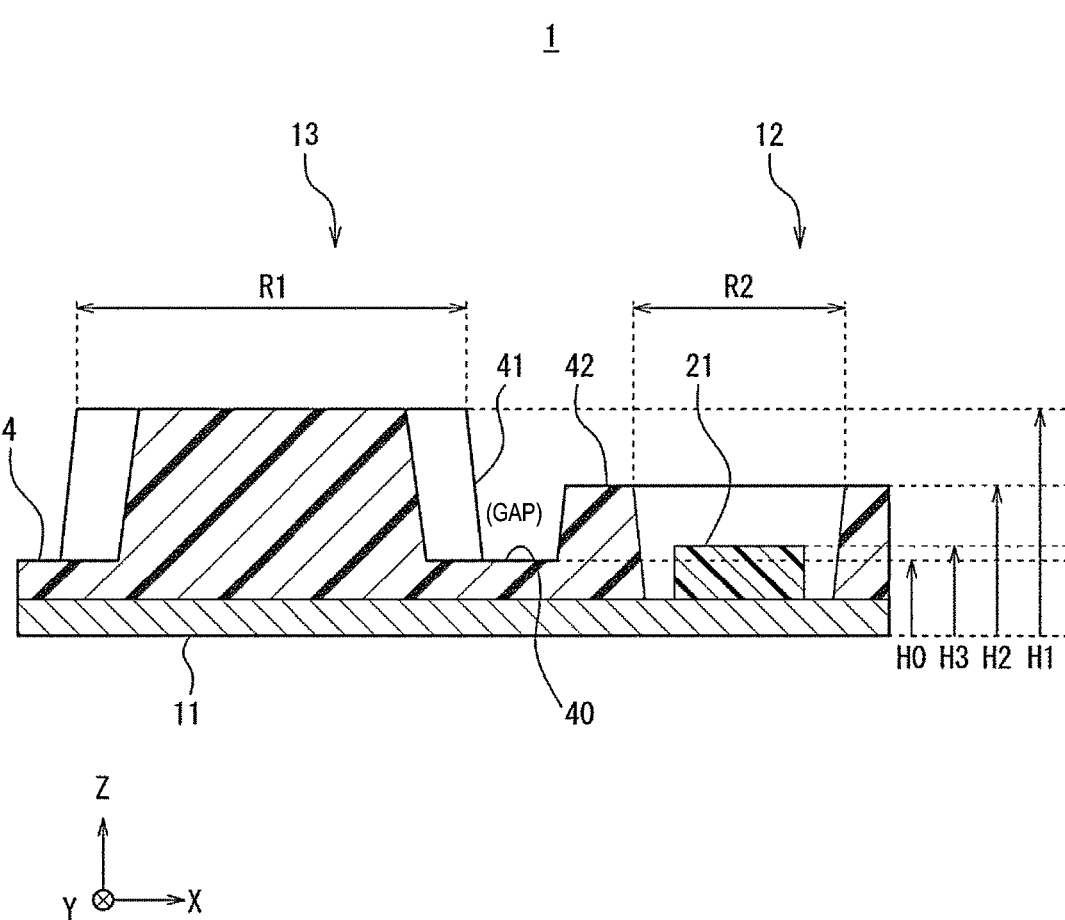
FIG. 3 is a cross-sectional view of the sensor device in FIG. 1.

FIG. 3 is a cross-sectional view of the sensor device 1 in FIG. 1. FIG. 4 is a perspective view of the cover 4 of the sensor device 1. FIG. 3 corresponds to the cross section taken along line A-A' in FIG. 1. The A-A' cross section is a cross section taken along the XZ plane across the light emitter 21.

In the sensor device 1 according to the present preferred embodiment, the cover 4 includes the cover portion 41 to cover the force sensor, the cover portion 42 to cover the proximity sensor, and a base portion 40 coupled to the cover portions 41 and 42. In the cover 4 according to the present preferred embodiment, as illustrated in, for example, FIG. 3, the cover portion 41 to covering the force sensor and the cover portion 42 to cover the proximity sensor are disposed with the base portion 40 interposed therebetween to leave a gap therebetween.

In the cover 4, the cover portions 41 and 42 for the respective sensors are integrally provided. Thus, the sensor device 1 can easily achieve a layout where the force sensor 13 and the proximity sensor 12 are located close to each other. This structure enables, for example, size reduction and ease of manufacturability of the sensor device 1, and thus enables, for example, improvement in successive detection performance described above.

However, simply integrating the covers for the respective sensors may cause interference between the force sensor and the proximity sensor due to various causes. For example, integrating the cover for the force sensor and the cover for the proximity sensor by directly coupling each other without leaving a gap therebetween may cause interference such as a case where the cover for the force sensor is unevenly deformed by a contact force due to the presence of the cover for the proximity sensor.

In contrast, the cover 4 according to the present preferred embodiment includes a gap between the cover portions 41 and 42. Thus, regardless of the presence of the cover portion 42 for the proximity sensor, the cover portion 41 for the force sensor can be uniformly deformed by a desired contact force, and the interference can be reduced or prevented. In the sensor device 1 according to the present preferred embodiment, the cover 4 is an example of an elastic member including the cover portion 41 for the force sensor defining and functioning as a first portion, the cover portion 42 for the proximity sensor defining and functioning as a second portion, and the base portion 40 defining and functioning as a third portion.

The cover 4 is made of, for example, an elastic material such as a silicone resin. The cover 4 has a Shore A hardness of, for example, higher than or equal to about 20 and lower than or equal to about 80. The cover 4 is not particularly limited to a silicone resin, and may be formed from any of various elastic materials, such as an epoxy resin, for example.

The base portion 40 is an elongated portion at a lower portion (located in the −Z direction) in the cover 4. For example, the base portion 40 is a flat portion parallel or substantially parallel to the substrate 11. For example, as illustrated in FIG. 3, a height H0 of the base portion 40 from the substrate 11 is lower than heights H1 and H2 of the cover portions 41 and 42. The base portion 40 defines the bottom of the gap between the cover portion 41 for the force sensor and the cover portion 42 for the proximity sensor (refer to FIG. 3).

The base portion 40 may have any structure that defines and functions as a coupler that couples the cover portions 41 and 42 to each other. For example, the base portion 40 is not particularly limited to a flat shape, but may have another shape. Instead of covering the entirety or substantially the entirety of the substrate 11 in particular, the base portion 40 may cover, for example, a limited area including a portion between the cover portions 41 and 42.

The cover portion 41 for the force sensor protrudes upward (in the +Z direction) to cover the force sensor device 3. The cover portion 41 for the force sensor is elastically deformable in accordance with, for example, exertion of a contact force, and is recoverable when the contact force is removed. The protruding shape of the cover portion 41 for the force sensor can be provided separately from the cover portion 42 for the proximity sensor in particular. The cover portion 41 for the force sensor with such a shape can uniquely define a portion of the force sensor 13 on which the contact force is exerted as the portion where the cover portion 41 protrudes. This structure facilitates detection of a force of the target object 5.

As illustrated in, for example, FIG. 3, the cover portion 41 for the force sensor has a taper shape with an outside diameter R1 in the XY cross section reducing upward (in the +Z direction). FIGS. 1 to 3 illustrate the cover portion 41 for the force sensor having a truncated cone shape as an example of the shape, but the cover portion 41 for the force sensor may have another shape. The cover portion 41 for the force sensor may have a shape of, for example, a circular cone, a quadrangular pyramid, a polygonal pyramid, a rectangular prism, or a semi-cylinder. The inside of the cover portion 41 for the force sensor may be filled with the same elastic material as the cover 4 or another material.

Figure 4:
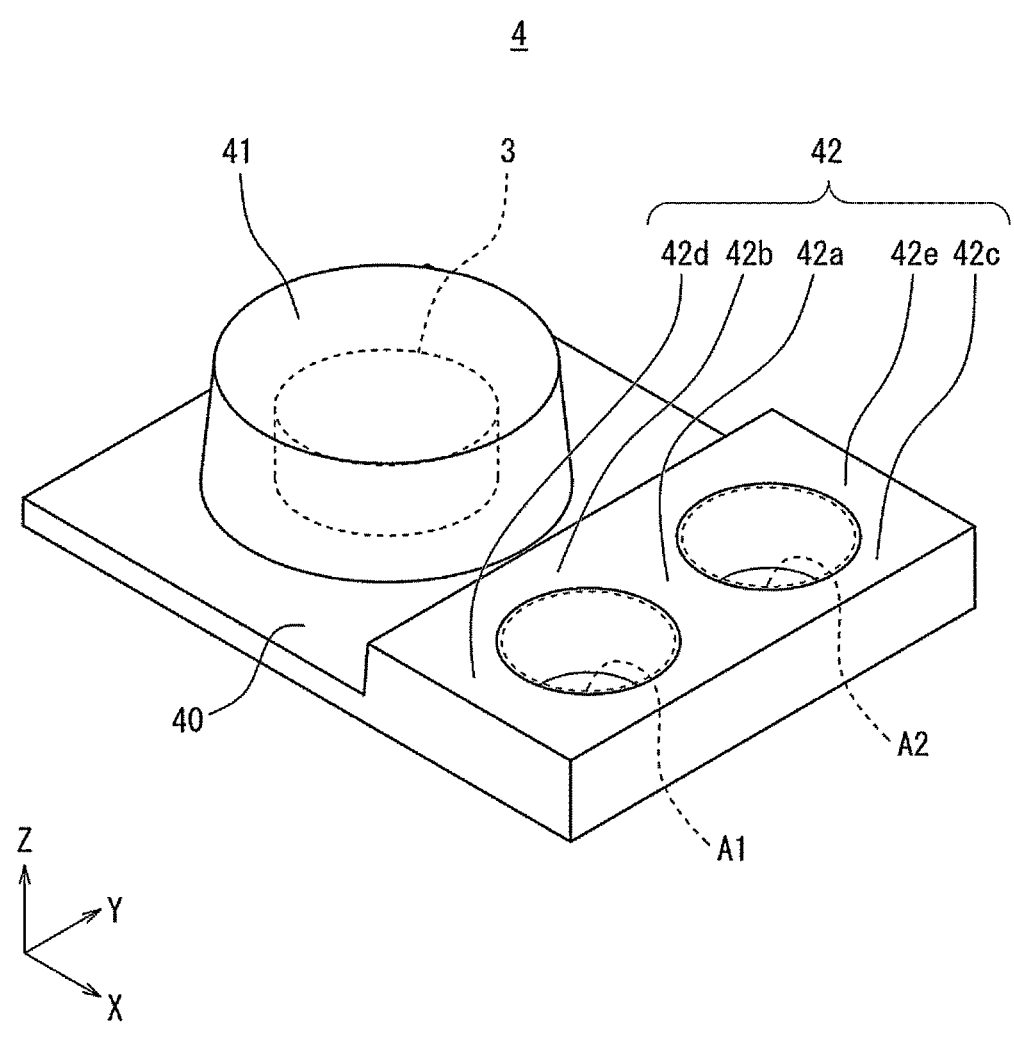
FIG. 4 is a perspective view of a cover of the sensor device according to the first preferred embodiment of the present invention.

As illustrated in, for example, FIG. 4, the cover portion 42 for the proximity sensor defines an open area A1 for light emission, and an open area A2 for light reception. The open area A1 for light emission surrounds the light emitter 21 to restrict the angle range within which the light emitter 21 can emit light, that is, a viewing angle (or a light distribution angle). The open area A2 for light reception surrounds the light receiver 22 to restrict the viewing angle of the light receiver 22.

In the present preferred embodiment, the cover portion 42 for the proximity sensor defines the open areas A1 and A2 to surround the entirety or substantially the entirety of the light emitter 21 and the entirety or substantially the entirety of the light receiver 22 while leaving a distance in the +Z direction from the light emitter 21 and the light receiver 22. Thus, the viewing angle of the proximity sensor 12 is directed in the Z direction to facilitate detection of the target object 5 that approaches the proximity sensor 12 from, for example, the side in the +Z direction (refer to FIG. 1).

In the present preferred embodiment, for example, as illustrated in FIG. 4, the cover portion 42 for the proximity sensor includes a center wall portion 42*a* located between the two open areas A1 and A2, and wall portions 42*b* to 42*e* on four sides of the open areas A1 and A2.

The center wall portion 42*a* of the cover portion 42 for the proximity sensor extends to separate the light emitter 21 from the light receiver 22 to interrupt light between the light emitter 21 and the light receiver 22 (refer to FIG. 1). This structure can particularly avoid direct coupling, that is, detection light emitted from the light emitter 21 being directly incident on the light receiver 22 without being reflected off, for example, the target object 5, and can reduce or prevent interference between the light emitter 21 and the light receiver 22.

The wall portion 42*b* located in the −X direction extends to separate the force sensor 13 from the light emitter 21 and the light receiver 22. The wall portion 42*b* can reduce or prevent various types of interference caused by, for example, the target object 5 that is in contact with the force sensor 13. This structure can prevent, for example, the cover portion 41 for the force sensor deformed by the contact force from coming into contact with the light emitter 21 or the light receiver 22.

The wall portion 42*c* located in the +X direction is located on the opposite side of the light emitter 21 and the light receiver 22 from the force sensor 13. The wall portion 42*d* located in the −Y direction is located on the opposite side of the light emitter 21 from the light receiver 22. The wall portion 42*e* located in the +Y direction is located on the opposite side of the light receiver 22 from the light emitter 21. Even when, for example, an external light source is located adjacent to the sensor device 1, the wall portions 42*c* to 42*e* can interrupt light from the external light source, and reduce or prevent interference between the external light source and the proximity sensor 12.

In addition, as illustrated in FIG. 3, the height H2 of the proximity sensor 12 from the substrate 11 (that is, the height of the cover portion 42 for the proximity sensor) is lower than the height H1 of the force sensor 13 (that is, the height of the cover portion 41 for the force sensor). This structure can reduce interference of the cover portion 42 for the proximity sensor with the target object 5 coming into contact with the force sensor 13, and reduce or prevent interference of the proximity sensor 12 with the force sensor 13.

The height H2 of the cover portion 42 for the proximity sensor is higher than the height H3 of the light emitter 21 and the light receiver 22. Thus, the cover portion 42 for the proximity sensor can easily protect the light emitter 21 and the light receiver 22 from contact from above, for example, contact of the target object 5. Although the present preferred embodiment illustrates an example where the light emitter 21 and the light receiver 22 have the same or substantially the same height H3 and the wall portions 42*a* to 42*e* have the same or substantially the same height H2, the present invention is not particularly limited to this case.

The cover portion 42 for the proximity sensor has, at, for example, the inner walls of the wall portions 42*a* to 42*e* defining the open areas A1 and A2, a taper shape with an opening diameter R2 in the XY cross section increasing upward (in the +Z direction). This directionality of the taper shape of the cover portion 42 for the proximity sensor agrees with the directionality of the taper shape of the cover portion 41 for the force sensor. For example, the side surface of the cover portion 41 for the force sensor located in the +X direction and the inner wall of the cover portion 42 for the proximity sensor located in the −X direction are both inclined further in the −X direction as they extend further upward.

The proximity sensor 12 with the above taper shape can easily maintain the viewing angle without interfering with the force sensor 13 in particular. In addition, the above taper shape of the cover portions 41 and 42 also defines and functions as a draft taper in forming of the cover 4 using, for example, a die set during manufacture of the sensor device 1, and facilitates manufacture of the sensor device 1.

In the cover 4 of the sensor device 1 described above, the cover portions 41 and 42 may have different hardnesses. For example, the cover 4 may be formed through two-shot molding using multiple materials having different hardness. For example, the cover portion 41 for the force sensor may have a lower hardness than the cover portion 42 for the proximity sensor to be softer. As the cover portion 41 for the force sensor is soft, it can more easily provide intuitive sensate feedback or be deformed in response to a press of the force sensor 13 for the purpose of use as, for example, an HMI.

The cover 4 may have optical characteristics of reflecting the detection light from the light emitter 21, and may be made of a material with, for example, a reflectance of higher than or equal to about 50%. Thus, the proximity sensor 12 can facilitate guiding of the detection light.

2-2. Controller of Sensor Device

Figure 5:
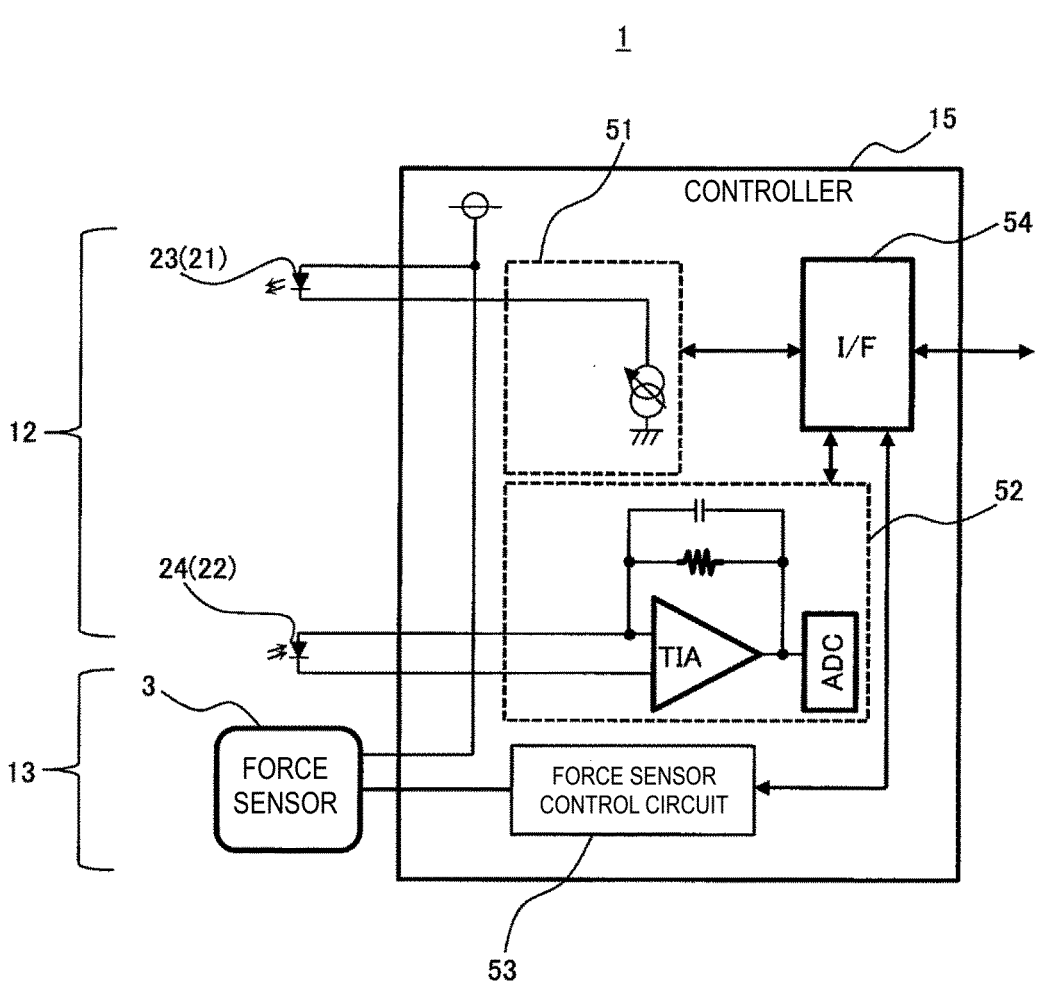
FIG. 5 is a circuit diagram of an example structure of the sensor device according to the first preferred embodiment of the present invention.

FIG. 5 is a circuit diagram of an electrical configuration of the sensor device 1 according to the present preferred embodiment. In addition to the above structure, the sensor device 1 according to the present preferred embodiment may further include a controller 15 as illustrated in FIG. 5.

As illustrated in, for example, FIG. 5, the controller 15 of the sensor device 1 includes a light emission control circuit 51, a light reception control circuit 52, a force sensor control circuit 53, and an interface circuit 54.

The light emission control circuit 51 includes a light-source driver electrically connected to, for example, the light emitting device 23. The light-source driver supplies a driving signal to emit detection light to the light emitting device 23. The light emission control circuit 51 may also include, for example, a modulator for amplitude modulation. For example, the light emission control circuit 51 may modulate the detection light using a specific frequency within, for example, about 10 Hz to about 1 MHz as a modulation frequency for cyclically modulating the optical amplitude. Modulation of the detection light facilitates discrimination of the detection light and its reflected light from disturbance light.

The light reception control circuit 52 includes, for example, an amplifier electrically connected to the light receiving device 24, and an analogue-to-digital (A/D) converter connected to the amplifier. The light reception control circuit 52 performs various signal processing on light reception signals output from the light receiving device 24 to output the signals to, for example, the interface circuit 54.

For example, the light reception control circuit 52 performs a process of detecting proximity of the target object 5 based on the amount of received reflected light in the light reception signal. Instead of the amount of received reflected light, the sensor device 1 may perform the proximity detection process based on, for example, a phase difference between reflected light and detection light. Such a proximity detection process does not necessarily have to be performed in the sensor device 1, and may be performed by, for example, an arithmetic circuit outside the sensor device 1. The sensor device 1 can detect proximity of an object such as the target object 5 by generating a light reception signal including the reflected light of the detection light in synchronization with driving of the light emitter 21.

The light reception control circuit 52 may perform a filtering process of using, for example, a band pass filter that allows a signal component including a modulation frequency of the detection light to pass therethrough, or may perform synchronous detection in synchronization with the light emission control circuit 51. For example, when the light reception control circuit 52 cuts off a steady DC component, the light reception control circuit 52 can analyze the reflected light separate from the disturbance light. The modulation frequency of the detection light can be set as appropriate to, for example, about 38 kHz used as a carrier of an infrared remote controller while avoiding the frequencies used by existing external systems. Thus, the sensor device 1 can reduce or prevent malfunctions attributable to external systems.

The force sensor control circuit 53 includes, for example, a control circuit that controls driving of various sensor elements of the force sensor device 3 in the force sensor 13, and an amplifier for signals output from the sensor elements. The force sensor control circuit 53 may include, for example, a circuit structure that generates a force detection signal indicating a detection result of a multi-axial force based on the output signal. Instead of the multi-axial force, the force sensor control circuit 53 may output a force detection signal indicating a detection result of a uniaxial force.

For example, when a piezoelectric method is used as the force detection method, the force sensor 13 uses the piezoelectric effect of one or more piezoelectric devices provided on the substrate in the force sensor 13 to convert the stress in the force sensor 13 that results from contact of the target object 5 (FIG. 1) into electric charges with the piezoelectric devices, and senses a force from the change. When an optical method is used, the force sensor 13 uses one or more light emitting devices and one or more light receiving devices disposed on the substrate in the force sensor 13 to read and sense, with the light receiving devices, a change of reflected light distribution in the force sensor 13 caused by deformation resulting from contact of the target object 5. When a strain resistance method is used, the force sensor 13 uses one or more strain gauges disposed on the substrate in the force sensor 13 to capture a strain, as a resistance change, transmitted to the strain gauges through the force sensor 13 caused by deformation resulting from contact of the target object 5, and to sense the force using the change. When an electrostatic capacity method is used, the force sensor 13 uses one or more electrostatic capacity detection electrodes disposed on the substrate in the force sensor 13 to sense a force based on a coupling capacitance change between the changing electrostatic capacity detection electrode and a reference potential caused by deformation of the force sensor 13 that results from contact of the target object 5. In each of the methods, a multi-axial force can be sensed by using multiple types of sensor elements provided in the force sensor 13 such as, for example, a piezoelectric device, light emitting and light receiving devices, a strain gauge, and an electrostatic capacity detection electrode.

The interface circuit 54 is connected to the light emission control circuit 51, the light reception control circuit 52, and the force sensor control circuit 53. The interface circuit 54 connects the sensor device 1 to an external device to input or output various signals.

The structure described above is an example, and the sensor device 1 is not limited to the above structure. For example, in the sensor device 1 according to the present preferred embodiment, any of the circuits 51 to 54 of the controller 15 may be defined by external components, or a module separate from the circuits 51 to 54 of the controller 15 may be provided.

3. Summarization

As described above, the sensor device 1 according to the present preferred embodiment includes the force sensor device 3 as an example of a force sensor disposed on the substrate 11, the light emitter 21 that emits light from over the substrate 11, the light receiver 22 that receives light on the substrate 11 and detects proximity of an object such as the target object 5, and the cover 4 as an example of an elastic member integrally made of an elastic material. The cover 4 includes the cover portion 41 for the force sensor as an example of the first portion, the cover portion 42 for the proximity sensor as an example of the second portion, and the base portion 40 as an example of the third portion. The cover portion 41 for the force sensor covers the force sensor device 3. The cover portion 42 for the proximity sensor extends around the light emitter 21 and the light receiver 22, through at least spaces between the light emitter 21, the light receiver 22, and the force sensor device 3. The base portion 40 couples the cover portion 41 for the force sensor and the cover portion 42 for the proximity sensor to each other. In the cover 4, the height H0 of the base portion 40 from the substrate 11 is lower than the height H1 of the cover portion 41 for the force sensor and the height H2 of the cover portion 42 for the proximity sensor (refer to FIG. 3).

In the above sensor device 1, the cover 4 couples the cover portion 41 for the force sensor and the cover portion 42 for the proximity sensor to each other while the base portion 40 with the height H0 that is low provides a gap therebetween, and thus can reduce or prevent interference in compatibility between detection of a force from the target object 5 and detection of proximity of the target object 5.

In the cover 4 according to the present preferred embodiment, the height H2 of the cover portion 42 for the proximity sensor is lower than the height H1 of the cover portion 41 for the force sensor. Thus, the cover portion 42 for the proximity sensor can reduce or prevent interference in detection of a force of the target object 5 that is in contact with the force sensor 13.

In the cover 4 according to the present preferred embodiment, the height H2 of the cover portion 42 for the proximity sensor is higher than the height H3 of the light emitter 21 and the light receiver 22. Thus, the cover portion 42 for the proximity sensor can reduce or prevent interference, such as a damage resulting from the target object 5 coming into contact with the light emitter 21 or the light receiver 22 when the target object 5 is to come into contact with the force sensor 13.

In the present preferred embodiment, the cover portion 42 for the proximity sensor in the cover 4 defines the open area A1 for light emission as an example of a first open area, and the open area A2 for light reception as an example of a second open area. The open area A1 for light emission surrounds the light emitter 21. The open area A2 for light reception surrounds the light receiver 22. The cover portion 42 for the proximity sensor can control the viewing angle (or light distribution) of the proximity sensor 12 using the open areas A1 and A2, and can facilitate proximity detection in accordance with force detection.

In the present preferred embodiment, the cover portion 41 for the force sensor in the cover 4 has a taper shape where the outside diameter R1 decreases as the position from the substrate 11 rises further. The cover portion 42 for the proximity sensor has a taper shape where the opening diameter increases as the position from the substrate 11 rises further. Thus, when the cover portion 41 for the force sensor and the cover portion 42 for the proximity sensor agree with each other in terms of the directionality of the taper shape, the viewing angle of the proximity sensor 12 or manufacturing interference can be reduced.

In the present preferred embodiment, the cover 4 may have a hardness of lower than or equal to a predetermined value (such as, for example, a Shore A of about 80) at at least the cover portion 41 for the force sensor. In this case, when the target object 5 exerts a contact force on the cover portion 41, the cover 4 can more easily provide feedback to the target object 5. In the present preferred embodiment, the cover 4 may have a hardness lower than or equal to the above predetermined value at the cover portion 41 for the force sensor and the cover portion 42 for the proximity sensor.

In the present preferred embodiment, the cover 4 may be made of, for example, an elastic material having a reflectance of higher than or equal to about 50% for the wavelength of the detection light emitted from the light emitter 21. Thus, the cover portion 42 for the proximity sensor can facilitate guiding of the detection light, and facilitate controlling light distribution of the proximity sensor 12.

Modified Example of First Preferred Embodiment

The above first preferred embodiment is described for a case where the substrate 11 in the sensor device 1 is a rigid substrate. The substrate 11 of the sensor device 1 is not particularly limited to this, and may be another type of substrates. Such a modified example is described with reference to FIG. 6.

Figure 6:
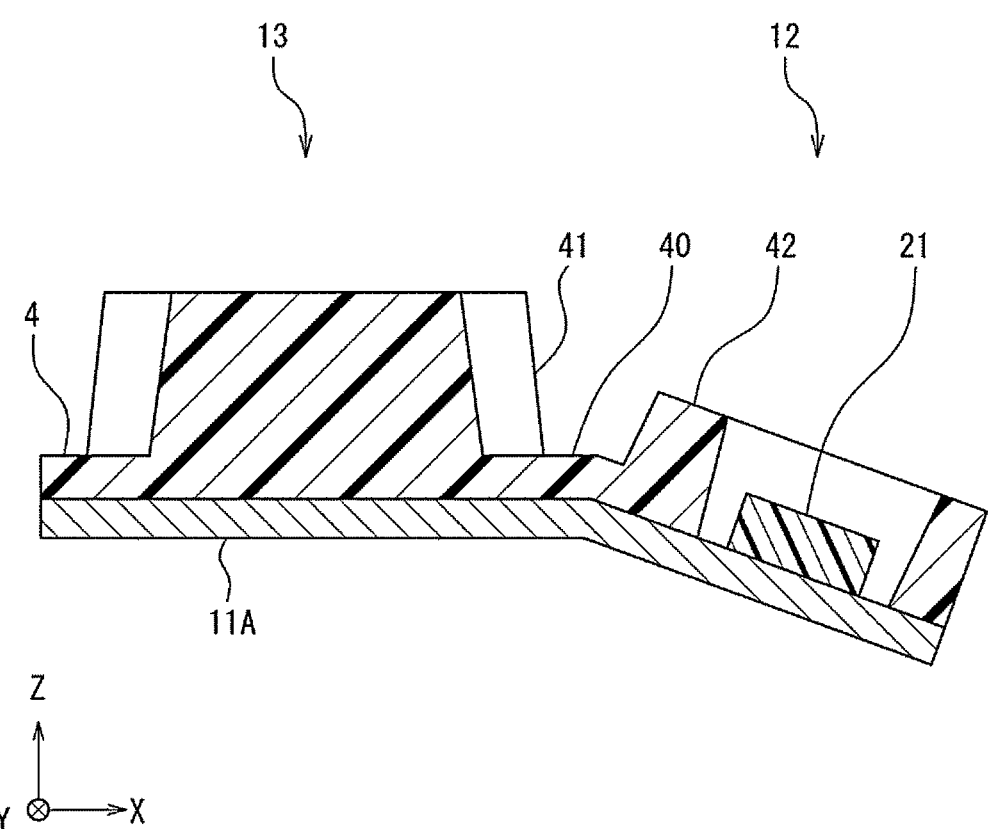
FIG. 6 is a perspective view of an example structure of a sensor device according to a modified example of the first preferred embodiment of the present invention.

FIG. 6 illustrates a structure of a sensor device 1A according to a modified example of the first preferred embodiment. FIG. 6 is a cross-sectional view of the sensor device 1A according to the present modified example, corresponding to FIG. 3. The sensor device 1A according to the present modified example has a similar structure to the sensor device 1 according to the first preferred embodiment, and includes a substrate 11A having flexibility.

In the sensor device 1A according to the present modified example, the substrate 11A is, for example, a flexible substrate or a rigid flexible substrate. The substrate 11A is bendable at, for example, a portion corresponding to the gap between the cover portion 41 for the force sensor and the cover portion 42 for the proximity sensor. In the present modified example, the cover 4 has bendable hardness at at least a portion of the base portion 40 corresponding to the gap.

As illustrated in FIG. 6, by bending the substrate 11A, the sensor device 1A can change the direction of the viewing angle of the proximity sensor 12 in, for example, the +X direction with respect to, for example, the force sensor 13. Thus, when, for example, the target object 5 approaches the force sensor 13 from the side in the +X direction, the proximity sensor 12 can more easily detect the target object 5 approaching itself before the target object 5 comes into contact with the force sensor 13.

As described above, in the sensor device 1A according to the present preferred embodiment, the substrate 11A may be flexible at at least a portion of the cover 4 between the cover portion 41 for the force sensor and the cover portion 42 for the proximity sensor. This structure can change the direction of the viewing angle of the proximity sensor 12 with respect to the location of the force sensor 13, and can facilitate compatibility between the force detection and the proximity detection.

Second Preferred Embodiment

In the above-described sensor device 1 according to the first preferred embodiment, the cover 4 surrounds the entireties or substantially the entireties of the light emitter 21 and the light receiver 22. In a sensor device according to the second preferred embodiment described with reference to FIG. 7, portions of the entire peripheries of the light emitter 21 and the light receiver 22 are open.

Figure 7:
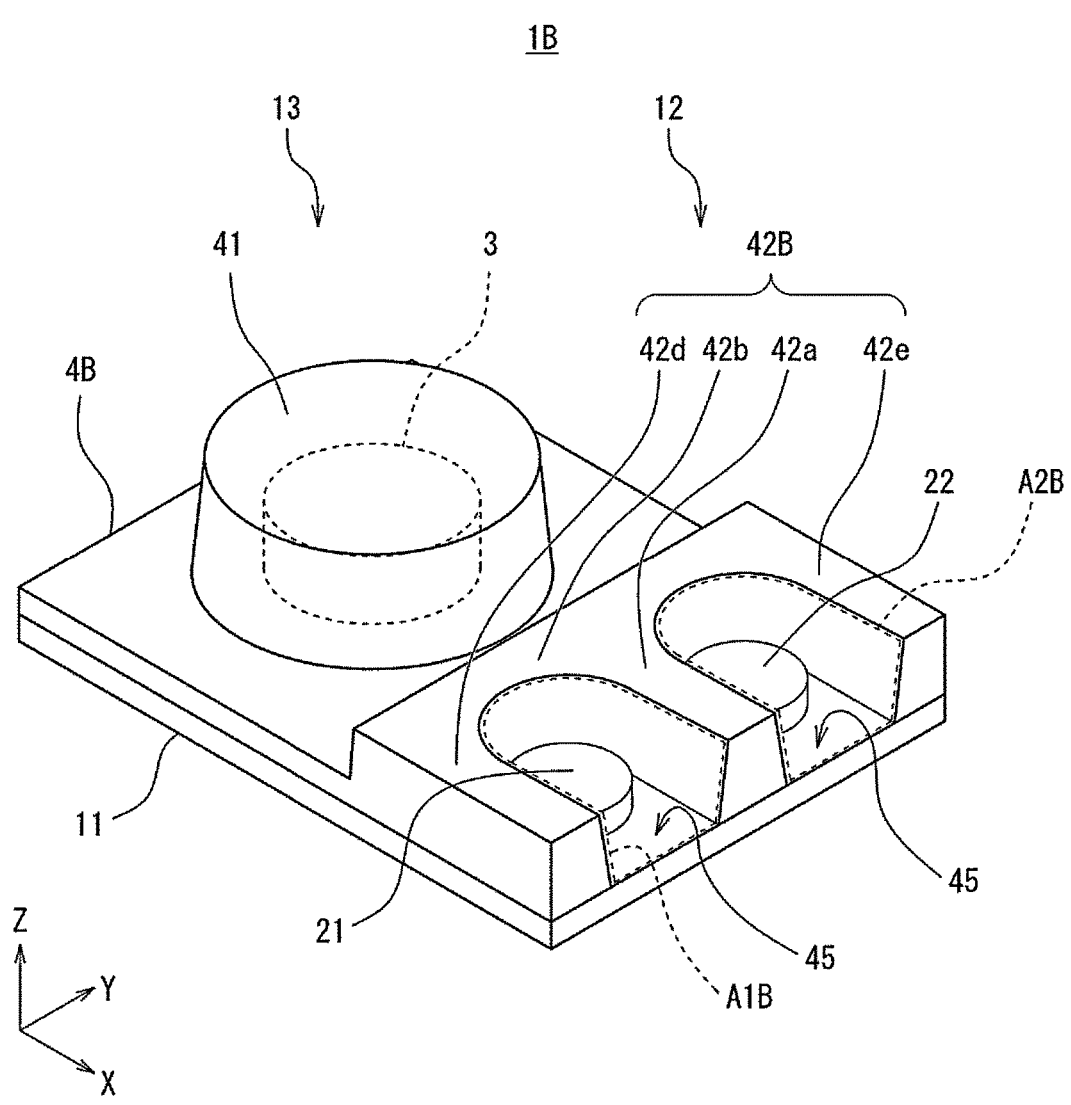
FIG. 7 is a perspective view of a structure of a sensor device according to a second preferred embodiment of the present invention.

FIG. 7 illustrates a sensor device 1B according to a second preferred embodiment of the present invention. In the sensor device 1 according to the first preferred embodiment, the cover portion 42 for the proximity sensor includes the wall portions 42a to 42e around the entireties of the light emitter 21 and the light receiver 22 (FIG. 4). The sensor device 1B according to the present preferred embodiment differs from the sensor device 1 according to the first preferred embodiment in that it includes a cover 4B including open ends 45, as illustrated in FIG. 7, instead of the wall portion 42c disposed opposite from the force sensor 13 (that is, disposed in the +X direction).

The open ends 45 in a cover 4B according to the present preferred embodiment are provided by extending the cover portion 42B for the proximity sensor while excluding portions in the +X direction from the cover portion 42B. The cover portion 42B defines open areas A1B and A2B together with the wall portions 42a, 42b, 42d, and 42e. The open areas A1B and A2B in the present preferred embodiment extend to the substrate 11 at the open ends 45 in the +X direction, or, have the lowest height from the substrate 11 at the portions in the +X direction.

In the sensor device 1 according to the first preferred embodiment, the open areas A1 and A2 in the wall portions 42a to 42e on the entire or substantially the entire peripheries (FIG. 4) direct the viewing angle of the proximity sensor 12 to the Z direction. In the cover 4B according to the present preferred embodiment, the open areas A1B and A2B including the open ends 45 direct the viewing angle of the proximity sensor 12 with a range from the Z direction to the +X direction.

For example, in a situation where the target object 5 approaches from the side in the +X direction rather than the side in the Z direction, the sensor device 1B according to the present preferred embodiment can facilitate detection of proximity of the target object 5 without particularly bending the substrate 11 (refer to FIG. 6).

As described above, in the sensor device 1B according to the present preferred embodiment, the open area A1B for light emission has a lowest height at a portion around the light emitter 21 opposite from the cover portion 41 for the force sensor (in the +X direction from the cover portion 41). The open area A2B for light reception has a lowest height at a portion around the light receiver 22 opposite from the cover portion 41 for the force sensor. Each of the open areas A1B and A2B can facilitate a control of directing the viewing angle of the proximity sensor 12 toward a side away from the force sensor 13, and can facilitate proximity detection in consideration of the compatibility with force detection.

In the present preferred embodiment, the cover portion 42B for the proximity sensor in the cover 4 extends around the light emitter 21 and the light receiver 22 except for portions opposite from the cover portion 41 for the force sensor. Thus, the cover portion 42B for the proximity sensor defines the open ends 45 at portions in the +X direction, and facilitates a control of the viewing angle of the proximity sensor 12 in consideration of the compatibility with force detection.

Third Preferred Embodiment

The sensor device 1B according to the second preferred embodiment sets the viewing angle of the proximity sensor 12 using the shape of the cover portion 42B for the proximity sensor. In a third preferred embodiment of the present invention, a sensor device that sets the viewing angle using an optical structure is described with reference to FIGS. 8 to 9.

Figure 8:
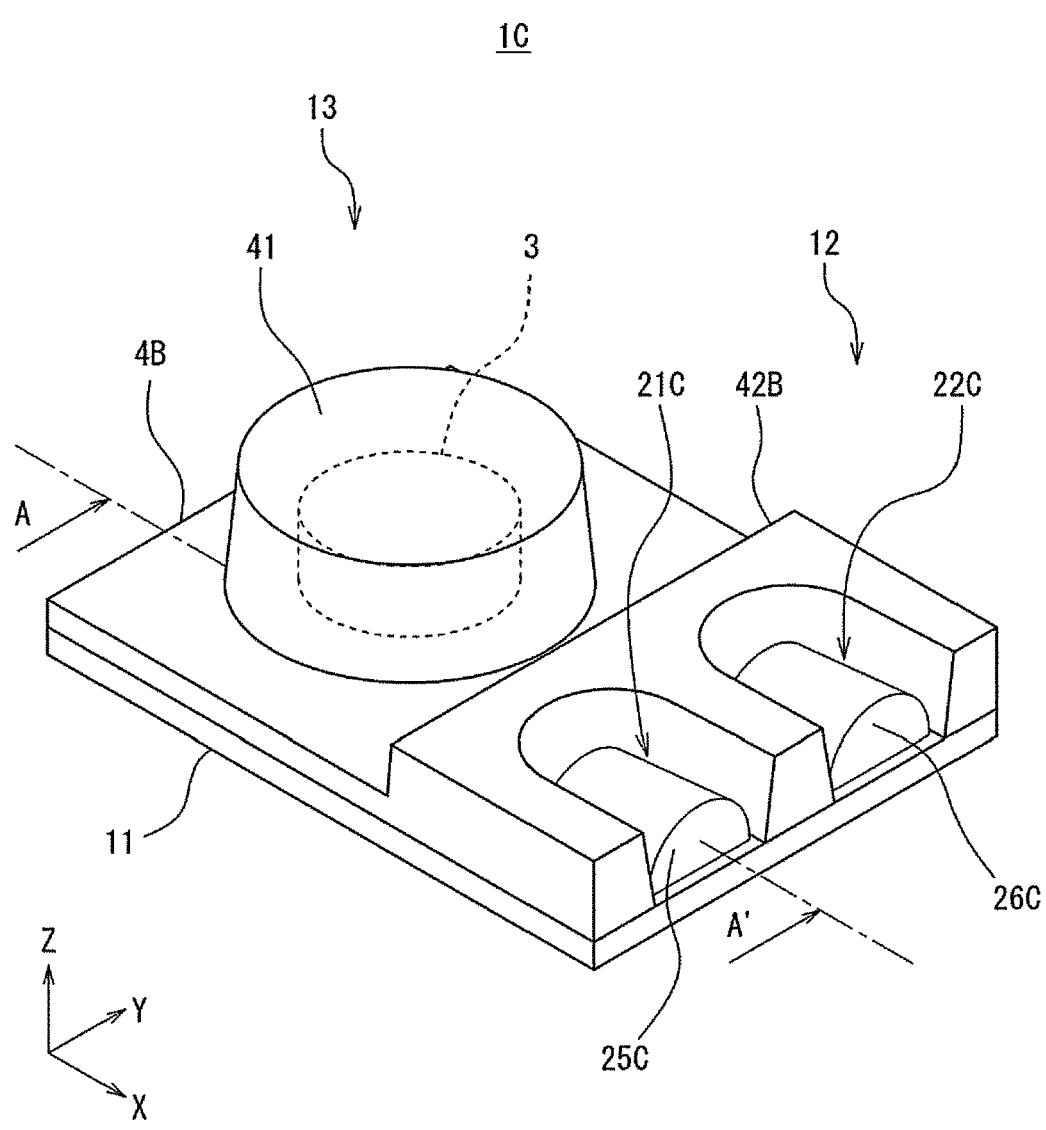
FIG. 8 is a perspective view of a structure of a sensor device according to a third preferred embodiment of the present invention.
Figure 9:
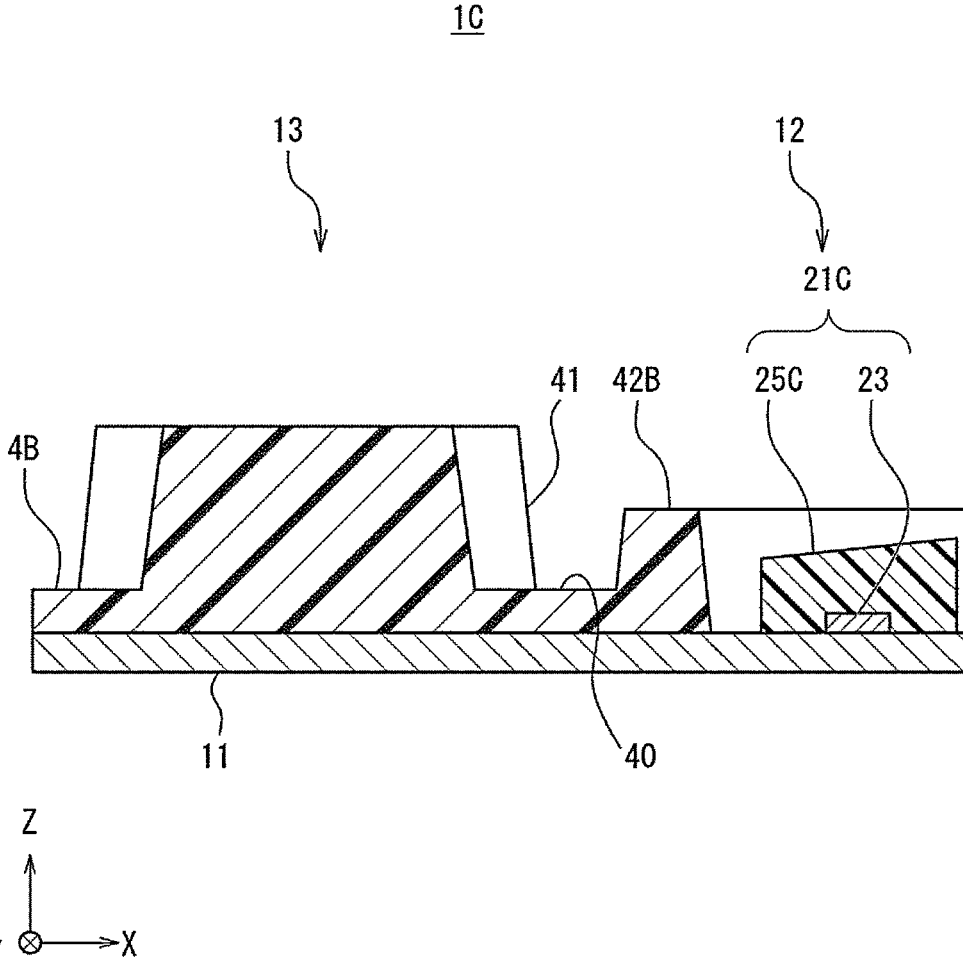
FIG. 9 is a cross-sectional view of a sensor device 1C in FIG. 8.

FIG. 8 illustrates a structure of a sensor device 1C according to the third preferred embodiment. FIG. 9 is a cross-sectional view of the sensor device 1C in FIG. 8 taken along line A-A'.

The sensor device 1C according to the present preferred embodiment differs from the sensor device 1B according to the second preferred embodiment in, for example, the shape of sealants 25C and 26C of a light emitter 21C and a light receiver 22C as illustrated in FIG. 8. In the present preferred embodiment, the sealants 25C and 26C are examples of first and second optical members.

In the present preferred embodiment, the sealant 25C of the light emitter 21C has a lens shape that refracts detection light emitted from the light emitting device 23 (FIG. 9) from the Z direction to the +X direction. The sealant 25C may have a condensing function to narrow the light distribution angle of a light flux emitted in the +X direction. For example, the sealant 25C of the light emitter 21C may have a shape with a curved surface that is inclined in the XZ cross section as illustrated in FIG. 9 and having a curvature in the YZ cross section as illustrated in FIG. 8. The sealant 26C of the light receiver 22C may be configured in the same or substantially the same manner as, for example, the sealant 25C of the light emitter 21C.

The above lens shape of the sealants 25C and 26C of the light emitter 21C and the light receiver 22C can improve the flexibility of light distribution control of the proximity sensor 12 in the sensor device 1C. Thus, the sensor device 1C can set appropriate light distribution in accordance with various purposes of use for which the sensor device 1C is used.

As described above, in the sensor device 1C according to the present preferred embodiment, the light emitter 21C includes the light emitting device 23 and the sealant 25C as an example of a first optical member. The sealant 25C of the light emitter 21C directs the detection light emitted from the light emitting device 23 to the direction away from the cover portion 41 for the force sensor. The light receiver 22C includes the light receiving device 24 and the sealant 26C as an example of the second optical member. The sealant 26C of the light receiver 22C directs light incident on the light receiving device 24, such as light reflected off the target object 5, to the direction away from the cover portion 41 for the force sensor. The sensor device 1C with this structure can facilitate light distribution control of the proximity sensor 12 using the sealants 25C and 26C in consideration of compatibility with force detection.

Fourth Preferred Embodiment

In a fourth preferred embodiment of the present invention, an example where an optical method is used as the force detection method is described with reference to FIGS. 10 to 12.

Figure 10:
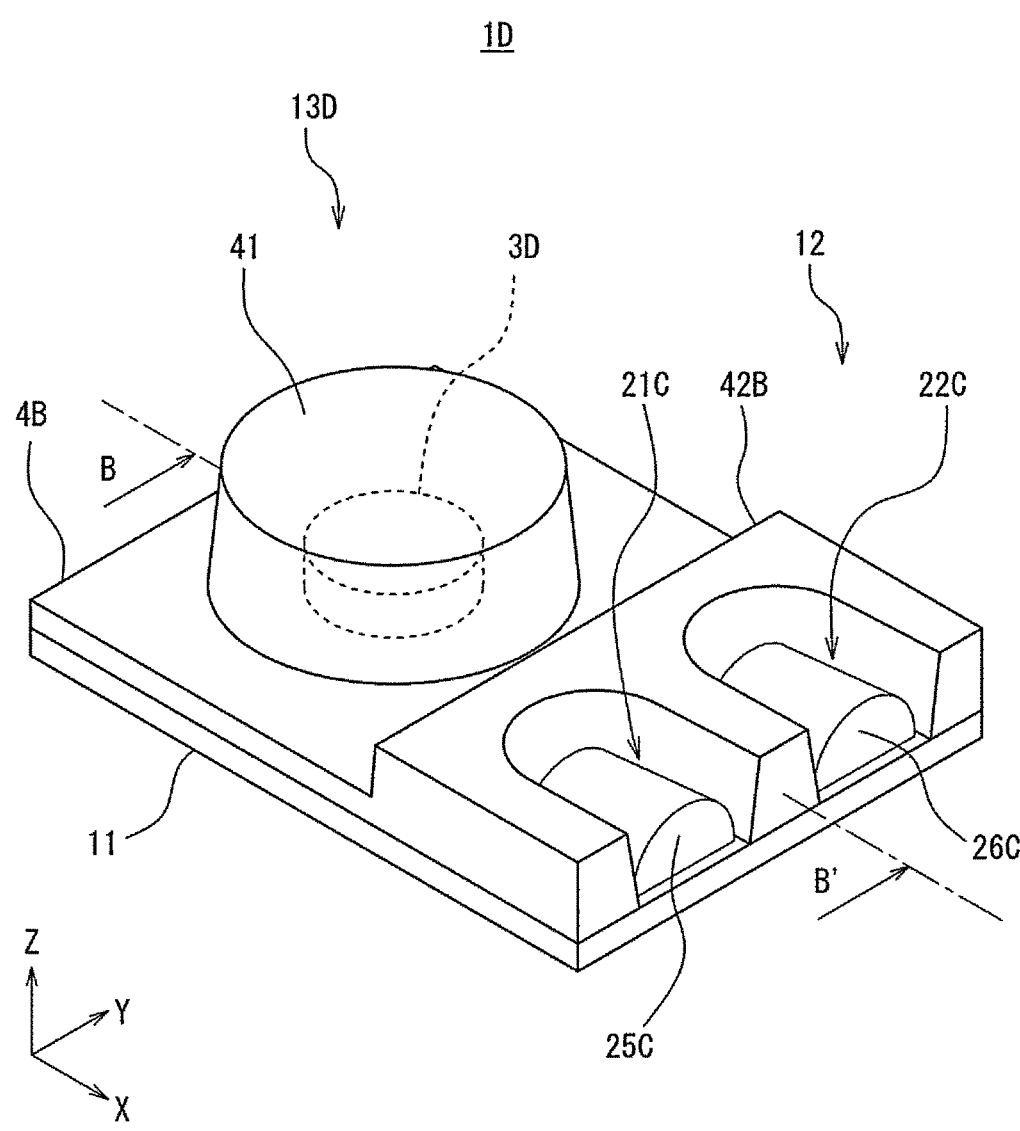
FIG. 10 is a perspective view of a sensor device according to a fourth preferred embodiment of the present invention.
Figure 11:
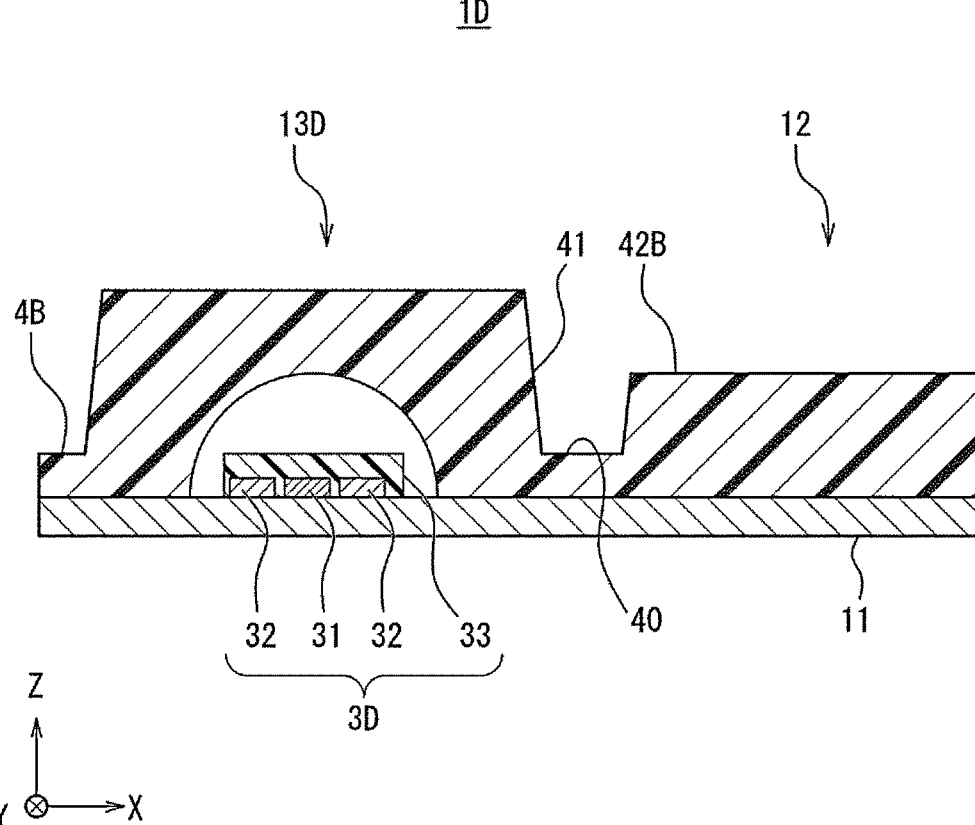
FIG. 11 is a cross-sectional view of a sensor device 1D taken along line B-B' in FIG. 10.

FIG. 10 is a perspective view of a sensor device 1D according to the fourth preferred embodiment. FIG. 11 is a cross-sectional view of the sensor device 1D taken along line B-B' in FIG. 10. B-B' cross section is a cross section taken along the XZ plane across a force sensor 13D.

The sensor device 1D according to the present preferred embodiment differs from, for example, the sensor device 1C according to the third preferred embodiment in that it includes a force sensor 13D that uses the optical method. As illustrated in, for example, FIG. 11, the force sensor 13D using the optical method includes a force sensor device 3D including a light emitting device 31 and light receiving devices 32. The light emitting device 31 and the light receiving devices 32 may be sealed with, for example, a sealant 33 made of a transparent resin.

In the force sensor 13D using the optical method, the cover portion 41 for the force sensor may have a hollow structure, or, may be filled with, for example, a transparent resin softer than the sealant 33. The inside of the cover portion 41 can reflect, for example, light from the light emitting device 31.

In the force sensor 13D using the optical method, the light emitting device 31 may include a light source such as a single-mode or multi-emitter-mode VCSEL, for example. For example, the light emitting device 31 emits light of a predetermined wavelength range such as an infrared range, as detection light for force detection. Instead of a VCSEL, the light emitting device 31 may include various types of solid light source elements such as an LD or an LED, for example. The light emitting device 31 may include multiple light source elements. The light emitting device 31 may include an optical system including components such as lenses and mirrors to collimate light from the light emitting device.

The light receiving devices 32 include light receivers such as PDs, for example, multiple light receivers arranged to surround the light emitting device 31. The light receiving devices 32 receive light such as reflected light from the detection light with the light receivers, and generate a light reception signal indicating, for example, the amount of received light as a light reception result. Instead of PDs, the light receiving devices 32 may include various types of light receivers such as phototransistors, PSDs, CISs, or CCDs, for example.

The cover portion 41 for the force sensor is formed from, for example, an elastic member having light shielding characteristics against light of the frequency band of the detection light emitted by the light emitting device 31.

The force sensor 13D using the optical method with the above structure detects the contact force of the target object 5 using a change of the state of how the light receiving devices 32 receive the reflected light obtained by reflecting the detection light emitted from the light emitting device 31 off a reflector 35. The state is changed in accordance with a force from the target object 5 in contact. A publicly known technology is applicable as appropriate as a method for measuring the contact force with the optical method (for example, refer to Patent Documents 1 to 3).

The force sensor 13D using the optical method can be collectively fabricated using the same or substantially the same manufacturing process as the proximity sensor 12, and thus can facilitate manufacture of the sensor device 1D. For example, the sealants 25C and 26C in the proximity sensor 12, and the sealants 33 on the light emitting device 31 and the light receiving device 32 in the force sensor 13D may be formed in the same process.

Figure 12:
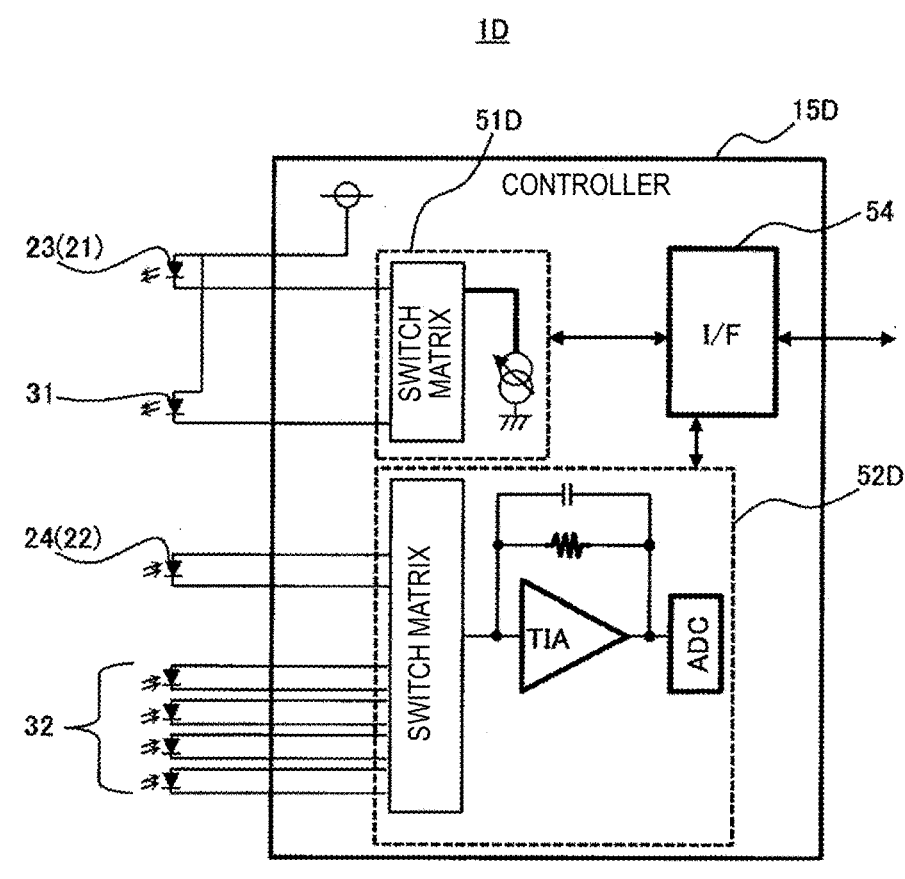
FIG. 12 is a circuit diagram of an example structure of the sensor device according to the fourth preferred embodiment of the present invention.

FIG. 12 is a circuit diagram of an electric structure of the sensor device 1D according to the fourth preferred embodiment. In the controller 15 of the sensor device 1 according to the first preferred embodiment, the force sensor control circuit 53 is provided separately from the light emission control circuit 51 and the light reception control circuit 52 to control the proximity sensor 12. A controller 15D in the sensor device 1D according to the present preferred embodiment differs from that in the first preferred embodiment in that, instead of the separate force sensor control circuit 53 (FIG. 5), a light emission control circuit 51D and a light reception control circuit 52D in the proximity sensor 12 control the force sensor 13D.

For example, as illustrated in FIG. 12, the light emission control circuit 51D according to the present preferred embodiment includes, for example, a switch matrix to control the light emitting device 31 of the force sensor 13D together with the light emitting device 23 of the proximity sensor 12. The light reception control circuit 52D according to the present preferred embodiment includes, for example, a switch matrix to control the light receiving device 32 of the force sensor 13D together with the light receiving device 24 of the proximity sensor 12. Thus, the function of controlling both the proximity sensor 12 and the force sensor 13D can be provided by the same circuit technology, and thus the number of components of the sensor device 1D can be reduce, and circuit integration can be facilitated.

For example, the controller 15D of the sensor device 1D according to the present preferred embodiment can be defined by, for example, a single integrated circuit (IC) shared by the function of controlling the proximity sensor 12 and the function of controlling the force sensor 13D. Thus, the sensor device 1D according to the present preferred embodiment can achieve size reduction and cost reduction.

As described above, in the sensor device 1D according to the present preferred embodiment, the force sensor 13D using the optical method includes, as the force sensor device 3D, the light emitting device 31 separate from the light emitting device 23 of the proximity sensor 12, and the light receiving devices 32 separate from the light receiving device 24 of the proximity sensor 12. The controller 15D of the sensor device 1D includes the light emission control circuit 51D that controls the light emitter 21 of the proximity sensor 12 and the light emitting device 31 of the force sensor 13D, and the light reception control circuit 52D that controls the light receiver 22 of the proximity sensor 12 and the light receiving device 32 of the force sensor 13D. When the proximity sensor 12 and the force sensor 13D in the sensor device 1D use the optical method, the circuit structure can also be simplified in addition to facilitation of manufacture of the sensor structure, and the sensor device 1D can be easily manufactured.

Other Preferred Embodiments

In the sensor device 1A according to the second preferred embodiment, the cover portion 42B for the proximity sensor includes open portions at positions in the +X direction in the peripheries of the light emitter 21 and the light receiver 22. In the present preferred embodiment, the cover portion 42 for the proximity sensor may include open portions at other positions in the peripheries of the light emitter 21 and the light receiver 22. Such a modified example is described with reference to FIG. 13.

Figure 13:
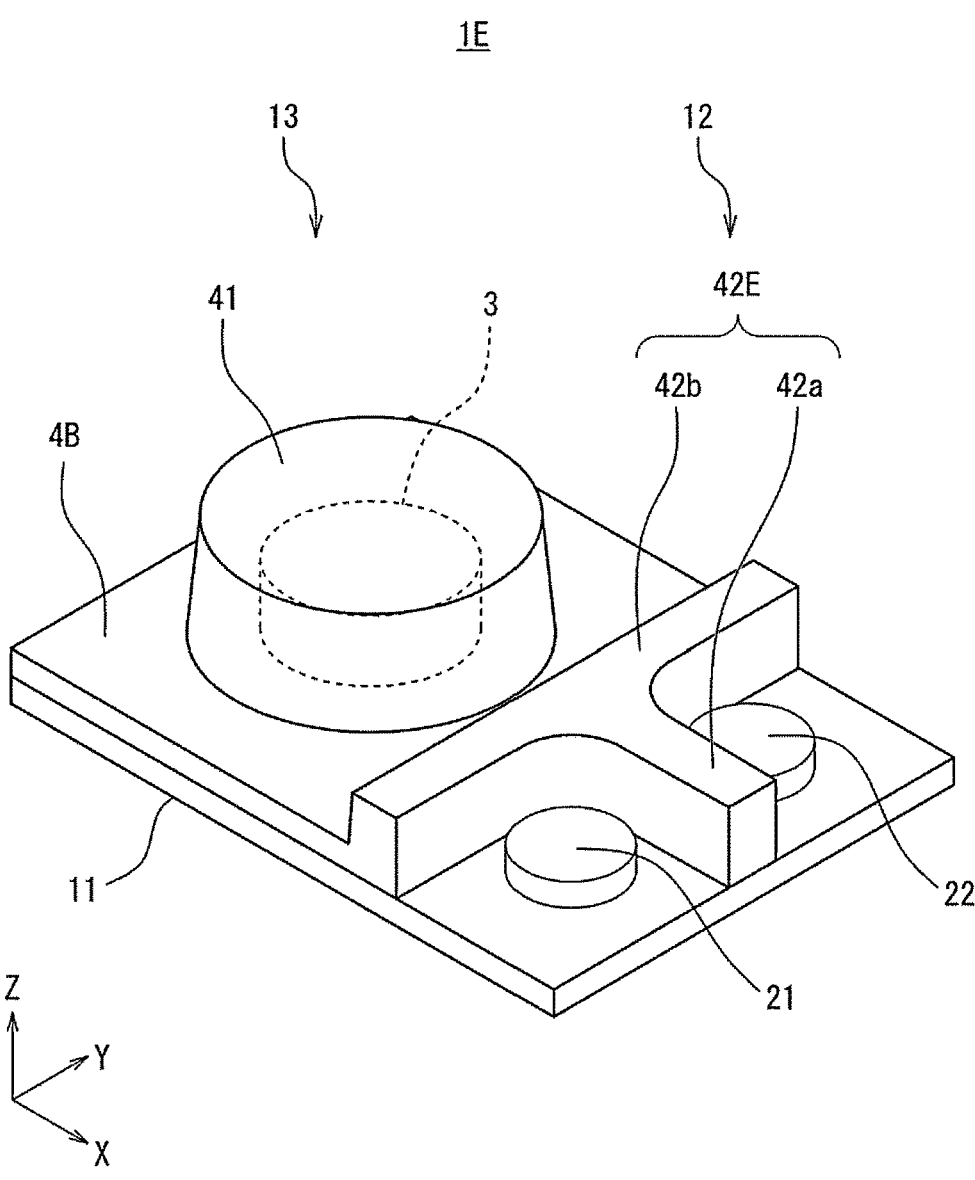
FIG. 13 is a perspective view of an example structure of a sensor according to a first modified example of a preferred embodiment of the present invention.

FIG. 13 illustrates a structure of a sensor device 1E according to a first modified example of a preferred embodiment of the present invention. In the present modified example, a cover 4E of the sensor device 1E includes a wall portion 42a between the light emitter 21 and the light receiver 22, and a cover portion 42E for the proximity sensor including a wall portion 42b in the +X direction and including open portions located in the ±Y direction and the −X direction. As in each of the above preferred embodiments, the cover 4E with this structure can also reduce interference in compatibility between the force sensor 13 and the proximity sensor 12.

In the above-described second preferred embodiment, the lowest height of the cover portion 42B for the proximity sensor in the open areas A1 and A2 is the same or substantially the same as that of the substrate 11, but the open areas A1 and A2 may have the lowest height higher than the substrate 11. Such a modified example is described with reference to FIG. 14.

Figure 14:
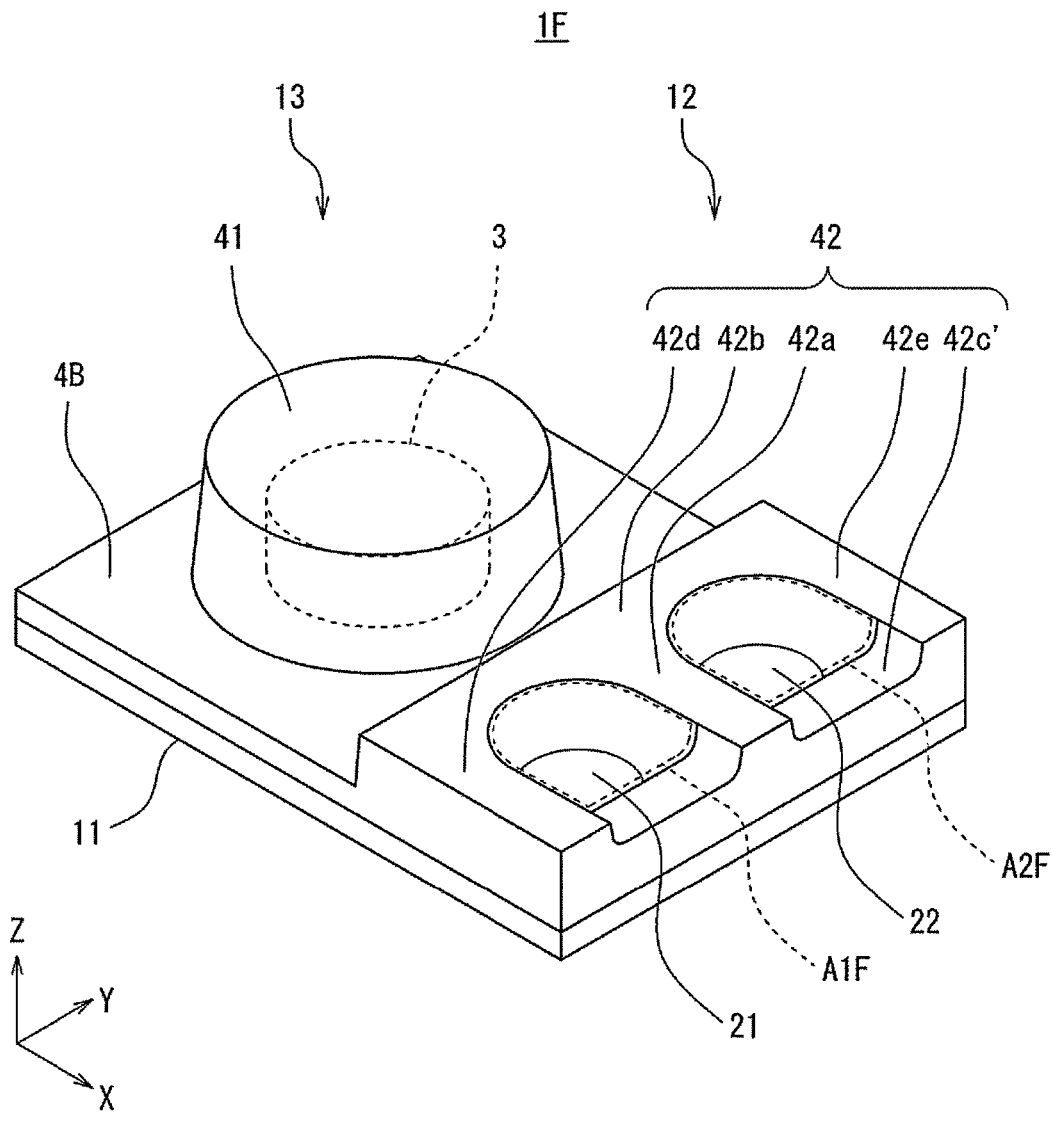
FIG. 14 is a perspective view of an example structure of a sensor device according to a second modified example of a preferred embodiment of the present invention.

FIG. 14 illustrates a structure of a sensor device 1F according to a second modified example of a preferred embodiment of the present invention. The sensor device 1F according to the present modified example differs from the sensor device 1B according to the second preferred embodiment in that it includes a cover 4F including a cover portion 42F for the proximity sensor including a low-height wall portion 42c' as illustrated in FIG. 14 instead of the open ends 45 (FIG. 7) located in the +X direction. The low-height wall portion 42c' defines the lowest height of the open areas A1F and A2F in the present modified example.

As in the case of, for example, the second preferred embodiment, the cover 4F according to the present modified example including the low-height wall portion 41c' to reduce the height to the lowest at portions around the open areas A1F and A2F located in the +X direction can direct the viewing angle of the proximity sensor 12 to the +X direction. For example, the wall portion 42c' has a higher height than the light emitter 21 and the light receiver 22, and lower than the other wall portions 42a, 42b, 42d, and 42e. The wall portion 42c' may have a lower height than or equal to the light emitter 21 and the light receiver 22.

As described above, in the sensor device 1F according to the present modified example, the cover portion 42F for the proximity sensor in the cover 4F may extend around the light emitter 21 and the light receiver 22 including a portion opposite from the cover portion 41 for the force sensor. This structure can also control the viewing angle of the proximity sensor 12.

Although each of the above-described preferred embodiments has described the base portion 40 as an example of the third portion, the third portion is not particularly to this. For example, with the elastic member according to the present preferred embodiment, the third portion may partially couple the first portion and the second portion to each other. Such a modified example is described with reference to FIG. 15.

Figure 15:
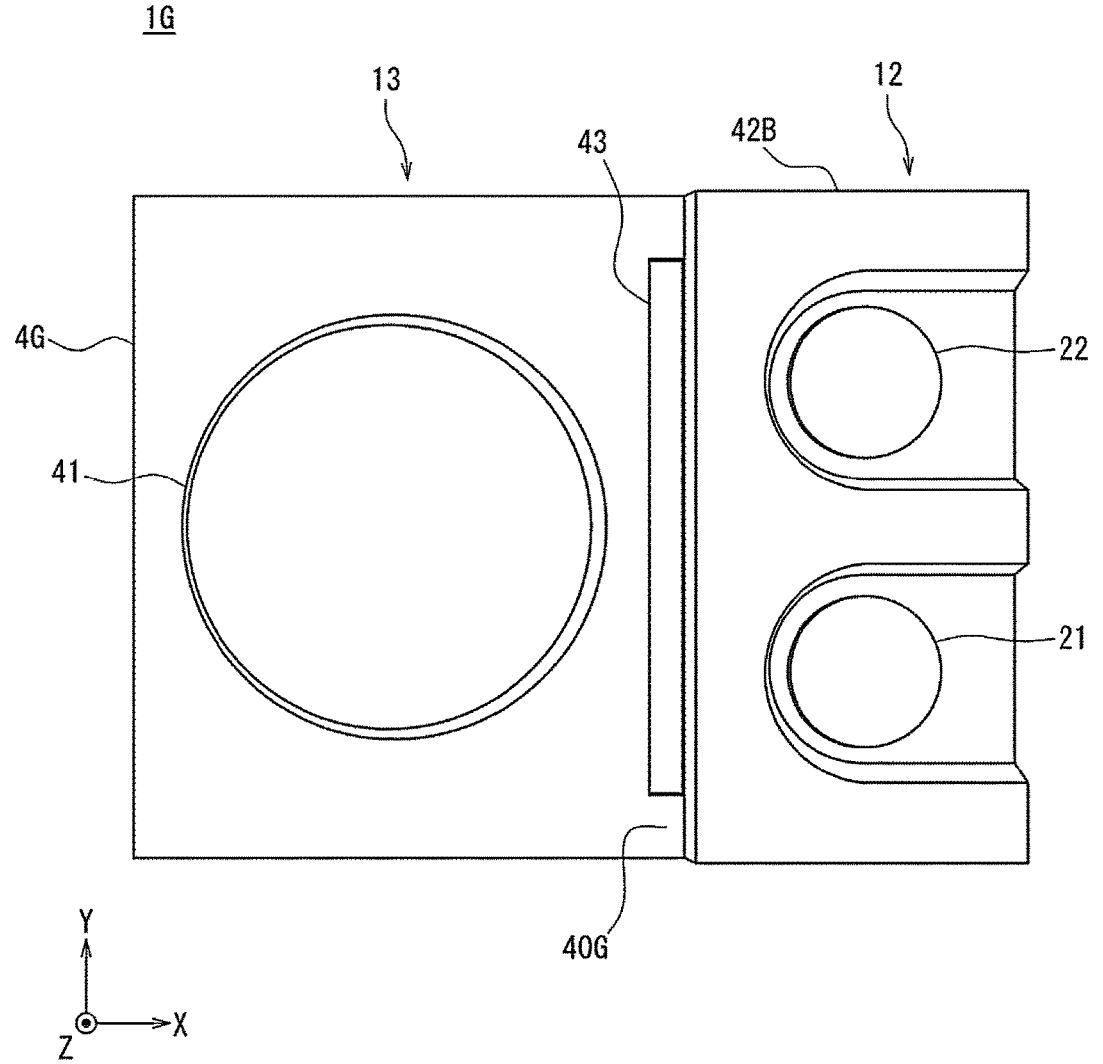
FIG. 15 is a perspective view of an example structure of a sensor device according to a third modified example of a preferred embodiment of the present invention.

FIG. 15 illustrates a structure of a sensor device 1G according to a third modified example of a preferred embodiment of the present invention. The sensor device 1G according to the present modified example differs from, for example, the sensor device 1B according to the second preferred embodiment in that it includes a cover 4G including a base portion 40G including a hole 43. In the sensor device 1G according to the present preferred embodiment, the cover 4G is an example of an elastic member including the base portion 40G including the hole 43 at a portion. The base portion 40G couples the cover portion 41 for the force sensor, that is, a first portion, and the cover portion 42B for the proximity sensor, that is, a second portion to each other. This structure reduces deformation of the cover portion 41 for the force sensor when, for example, the substrate bends near the hole 43 of the base portion 40G, and thus can reduce or prevent characteristic changes of the force sensor 13.

The base portion 40G according to the present preferred embodiment is an example of a third portion that partially couples the first portion and the second portion to each other. As in each of the above-described preferred embodiments, the sensor device 1G according to the present preferred embodiment can also reduce interference in compatibility between force detection at the first portion and proximity detection at the second portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A sensor device, comprising:
a substrate;
a force sensor on the substrate;
a light emitter to emit light from over the substrate;
a light receiver to receive light on the substrate, and detect proximity of an object; and
an elastic cover made of an elastic material; wherein
the elastic cover includes:
    a first portion covering the force sensor;
    a second portion extending around the light emitter and the light receiver, through at least spaces between the light emitter, the light receiver, and the force sensor; and
    a third portion coupling the first portion and the second portion to each other;
the third portion in the elastic cover has a lower height from the substrate than the first and second portions; and
the elastic cover includes a gap between the first portion and the second portion.

2. The sensor device according to claim 1, wherein the second portion in the elastic cover has a lower height than the first portion.

3. The sensor device according to claim 1, wherein the second portion in the elastic cover has a higher height than the light emitter and the light receiver.

4. The sensor device according to claim 1, wherein the second portion in the elastic cover defines a first open area surrounding the light emitter and a second open area surrounding the light receiver.

5. The sensor device according to claim 4, wherein
the first open area has a lowest height at a portion around the light emitter opposite from the first portion; and the second open area has a lowest height at a portion around the light receiver opposite from the first portion.

6. The sensor device according to claim 1, wherein the second portion in the elastic cover extends around the light emitter and the light receiver except for portions opposite from the first portion.

7. The sensor device according to claim 1, wherein
the first portion in the elastic cover has a taper shape in which an outside diameter decreases as a height from the substrate increases; and
the second portion has a taper shape in which an outside diameter increases as a height from the substrate increases.

8. The sensor device according to claim 1, wherein the substrate has flexibility at at least a portion between the first portion and the second portion in the elastic cover.

9. The sensor device according to claim 1, wherein
the light emitter includes:
    a light emitting portion; and
    a first optical portion to direct light emitted from the light emitting portion to a direction away from the first portion; and
the light receiver includes:
    a light receiving portion; and
    a second optical portion to direct light incident on the light receiving portion to a direction away from the first portion.

10. The sensor device according to claim 1, wherein
the force sensor includes:
    a light emitting portion separate from the light emitter; and
    a light receiving portion separate from the light receiver; and
the sensor device further comprising:
    a light emission control circuit to control the light emitter and the light emitting portion of the force sensor; and
    a light reception control circuit to control the light receiver and the light receiving portion of the force sensor.

11. The sensor device according to claim 1, wherein the substrate is rigid.

12. The sensor device according to claim 9, wherein the light emitter includes a light emitting diode.

13. The sensor device according to claim 10, wherein the light emitter includes a light emitting diode.

14. The sensor device according to claim 9, wherein the light receiver includes a sealant sealing the light receiving portion.

15. The sensor device according to claim 14, wherein the sealant is a resin having transparency to light.

16. The sensor device according to claim 9, wherein the light receiving portion includes at least one photodiode.

17. The sensor device according to claim 1, wherein the elastic material is a silicone resin.

18. The sensor device according to claim 1, wherein the elastic cover has a Shore A hardness of higher than or equal to about 20 and lower than or equal to about 80.

\* \* \* \* \*